United States Patent
Lee et al.

(10) Patent No.: US 8,722,469 B2
(45) Date of Patent: May 13, 2014

(54) MEMORY CELL AND PROCESS FOR MANUFACTURING THE SAME

(75) Inventors: Ming-Daou Lee, Hsinchu (TW); Chia-Hua Ho, Hsinchu (TW); Erh-Kun Lai, Hsinchu (TW); Kuang-Yeu Hsieh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 1464 days.

(21) Appl. No.: 11/867,000

(22) Filed: Oct. 4, 2007

(65) Prior Publication Data
US 2008/0237798 A1 Oct. 2, 2008

Related U.S. Application Data

(60) Provisional application No. 60/828,211, filed on Oct. 4, 2006.

(51) Int. Cl.
*H01L 29/788* (2006.01)

(52) U.S. Cl.
USPC ............. 438/133; 257/E27.078; 257/E21.422

(58) Field of Classification Search
USPC ........................................................ 438/133
See application file for complete search history.

(56) References Cited

U.S. PATENT DOCUMENTS

| | | | |
|---|---|---|---|
| 7,166,886 B2 * | 1/2007 | Forbes ........................... | 257/315 |
| 2003/0048666 A1 * | 3/2003 | Eldridge et al. ......... | 365/185.28 |
| 2004/0026729 A9 | 2/2004 | Krieger et al. | |
| 2004/0160830 A1 | 8/2004 | Forbes | |
| 2005/0151277 A1 * | 7/2005 | Kawazoe et al. ............. | 257/904 |

FOREIGN PATENT DOCUMENTS

| | | |
|---|---|---|
| CN | 1574363 | 2/2005 |
| WO | 2005024839 | 3/2005 |

OTHER PUBLICATIONS

Christopher G. Parker, Design, Optimization, and Characterization of a Low Temprature RPECVD MOS Gate Stack Process, 1993 IEEE, pp. 208-212.*
Article titled "Bistable Characteristics and Switching Mechanisms of TiOx-based Resistance Memory (ReRAM) Prepared by Ion-Beam Deposition and by Plasma Oxidation" jointly authored by Lee et al., Emerging Central Lab, MCIX, Taiwan, two pages.
"1st Office Action of China counterpart application", issued on Oct. 16, 2009, p. 1-p. 5.
"Office Action of Taiwan counterpart application" issued on Sep. 14, 2012, p. 1-p. 5.
Rohde et al., "Identification of a determining parameter for resistive switching of TiO2 thin films," Appl. Phys. Lett. 86, Jun. 23, 2005, pp. 262907-1-262907-3.
"Office Action of Taiwan counterpart application" issued on Feb. 6, 2013, p. 1-p. 5.

* cited by examiner

*Primary Examiner* — Julio J Maldonado
*Assistant Examiner* — Mohammad Choudhry
(74) *Attorney, Agent, or Firm* — Jianq Chyun IP Office

(57) ABSTRACT

A memory cell and a process for manufacturing the same are provided. In the process, a first electrode layer is formed on a conductive layer over a substrate, and then a transition metal layer is formed on the first electrode layer. After that, the transition metal layer is subjected to a plasma oxidation step to form a transition metal oxide layer as a precursor of a data storage layer, and a second electrode layer is formed on the transition metal oxide layer. A memory cell is formed after the second electrode layer, the transition metal oxide layer and the first electrode layer are patterned into a second electrode, a data storage layer and a first electrode, respectively.

25 Claims, 5 Drawing Sheets

MEMORY CELL AND PROCESS FOR MANUFACTURING THE SAME

CROSS-REFERENCE TO RELATED APPLICATION

This application claims the priority benefit of U.S. provisional application Ser. No. 60/828,211, filed on Oct. 4, 2006, all disclosures are incorporated herein by reference.

BACKGROUND OF THE INVENTION

1. Field of the Invention

The invention relates to a memory cell and a process for manufacturing the same, and more particularly relates to a memory cell of a resistance memory and a process for manufacturing the same.

2. Description of the Related Art

Along with popularity of consumer electronic products and wide application of system products, the requirements on memories, which include low power consumption, low cost, high read/write speed and more times of programming, are getting higher and higher. Therefore, new technologies for the memories from separated markets are presented to breakthrough current restrictions of the memories, and hopefully become the mainstream technology for the new generation memories.

Among the newly released memories, there is a memory that records data by changing the resistivity of a data storage layer. Generally, such a resistance memory employs an electrical pulse and applies a switching voltage to change the status of a simple binary metal oxide thin film or a complex perovskite oxide thin film between a set state and a reset state, so that the data are stored based on different resistivities in different states. The technology possesses advantages of high speed of a static random access memory (SRAM), high density of a dynamic random access memory (DRAM), low cost, low power consumption and non-volatility, and has played an important role in the development of the semiconductor industry. One example of such memories is the non-volatile random-access memory (NVRAM).

Conventionally, the data storage layer of a resistance memory is formed by depositing a layer of PrCaMnO (PCMO), nickel oxide (NiO) or titanium oxide ($TiO_x$). However, the resistance memories using the above materials have disadvantages that the process is complicated, the deposition temperature is high (approximately 300° C.), the switching voltage is high (approximately 10V) and the data retention time is short.

SUMMARY OF THE INVENTION

The invention is directed to a memory cell and a manufacturing method thereof. The memory cell includes a data storage layer that is a transition metal oxide layer formed by performing a plasma oxidation step to a transition metal layer. The memory cell has the advantages of long data retention time, low switching voltage, high product quality and saving development cost for the manufacturing process.

According to a first aspect of the present invention, a process for manufacturing a memory cell is provided. A first electrode layer is formed on a conductive layer over a substrate, and then a transition metal layer is formed on the first electrode layer. After that, a plasma oxidation step is performed to the transition metal layer to form a transition metal oxide layer as a precursor of a data storage layer, and then a second electrode layer is formed on the transition metal oxide layer.

The process may further include a step of patterning the second electrode layer, the transition metal oxide layer and the first electrode layer into a second electrode, a data storage layer and a first electrode, respectively. After that, a dielectric layer is formed over the conductive layer covering the sidewalls of the first electrode, the data storage layer and the second electrode. A bit line may be formed on the dielectric layer and the second electrode after the dielectric layer is formed.

According to a second aspect of the present invention, a memory cell including a first electrode, a second electrode and a transition metal oxide layer as a data storage layer is provided. The first electrode is disposed on a conductive layer over a substrate. The transition metal oxide layer is disposed on the first electrode, and is formed with a plasma oxidation step. The second electrode is disposed on the transition metal oxide layer.

The memory cell may further include a dielectric layer that is disposed over the conductive layer covering the sidewalls of the first electrode, the transition metal oxide layer and the second electrode, wherein the top surface of the dielectric layer and that of the second electrode are coplanar. In addition, the memory cell may further include a bit line disposed on the second electrode and the dielectric layer.

It is to be understood that both the foregoing general description and the following detailed description are exemplary, and are intended to provide further explanation of the invention as claimed.

BRIEF DESCRIPTION OF THE DRAWINGS

FIGS. 1A-1G illustrate, in a cross-sectional view, a process for manufacturing a memory cell according to an embodiment of the invention, wherein FIG. 1G shows the resulting memory cell.

DETAILED DESCRIPTION OF THE INVENTION

Figure 1A:
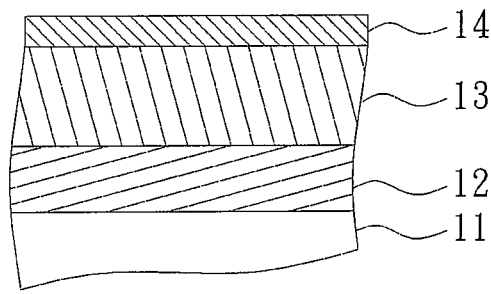

The invention is elaborated in the embodiment below, which serves as an example but is not for limiting the scope of the invention. Further, unessential elements are omitted in the drawings of the embodiment to highlight the technical characteristics of the invention.

Figure 1B:
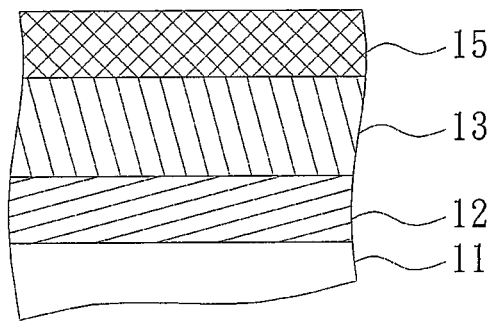
Figure 1C:
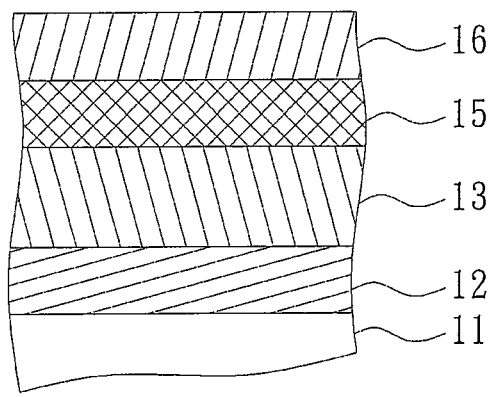
Figure 1D:
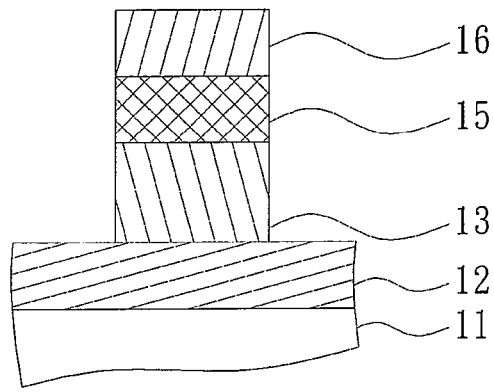
Figure 1E:
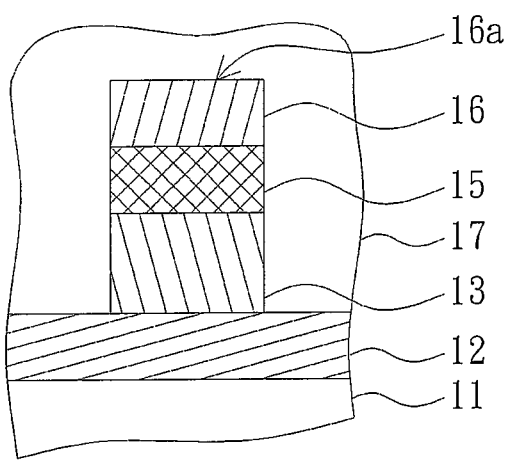
Figure 1F:
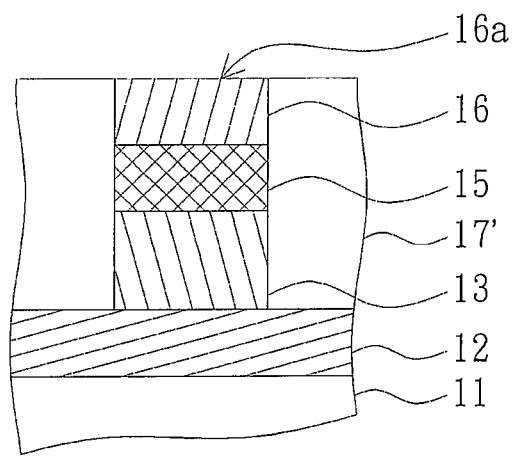
Figure 1G:
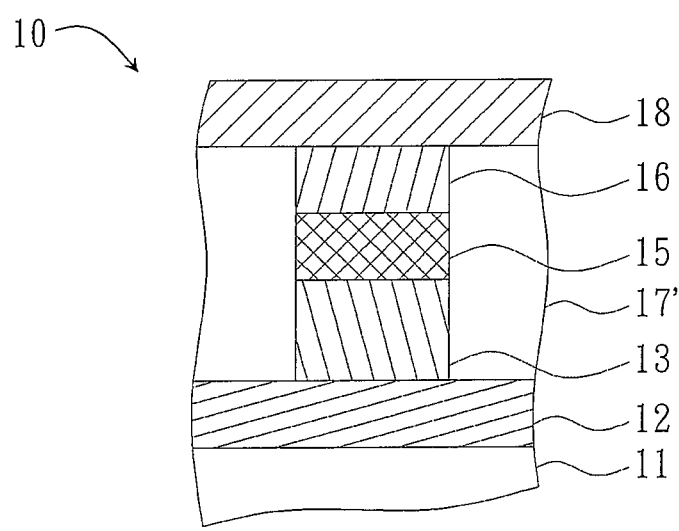

FIGS. 1A-1G illustrate, in a cross-sectional view, a process for manufacturing a memory cell in the embodiment of this invention, wherein FIG. 1G shows the resulting memory cell. The memory cell may be a memory cell of a non-volatile random-access memory (NVRAM) or the like. The data storage layer of an NVRAM cell is required to be capable of maintaining a resistivity difference between different storage states of the NVRAM cell within a certain retention time.

Referring to FIG. 1A, a substrate 11 is provided, which may be composed of $SiO_2$. Then, a conductive layer 12 that may serve as a metal conductive wire of the memory cell, a first electrode layer 13 and a transition metal layer 14 are formed on the substrate 11 in sequence. The conductive layer 12 may include copper or silver, and may be formed through sputtering or electron evaporation. The first electrode layer 13 may include TiN, Ti, Pt, Ta, Al or Cu, and may be formed through sputtering or electron evaporation. The transition metal layer 14 may include titanium, Cu, PrCaMn, Ni or W, and may be formed through physical vapor deposition like sputtering or electron evaporation, or through chemical vapor deposition. In addition, the thickness of the conductive layer 12 may range from 1000 Å to 10000 Å. The thickness of the first electrode layer 13 may range from 1000 Å to 10000 Å. The thickness of the transition metal layer 14 may range from 1000 Å to 10000 Å.

Referring to FIG. 1B, a plasma oxidation step is performed to the transition metal layer 14 to form a transition metal oxide layer 15 that is to be patterned into a data storage layer and is considered as a precursor of the data storage layer. The plasma oxidation step may be a down-stream (remote) plasma oxidation step. The reaction gas used in the plasma oxidation step includes an oxidizing gas like oxygen gas, and preferably further includes an assist gas selected from the group consisting of nitrogen gas and argon. The pressure set in the plasma oxidation step may range from 1 mTorr to 10,000 mTorr, preferably about 3,000 mTorr. The temperature set in the plasma oxidation step may range from 100° C. to 500° C., preferably about 265° C. The flow rate of the oxidizing gas may range from 10 sccm to 10000 sccm.

In a preferred embodiment, oxygen gas as an oxidizing gas and nitrogen gas as an assist gas are used in the plasma oxidation step, wherein oxygen gas is supplied in a flow rate of 10 sccm to 10,000 sccm, preferably about 4,000 sccm, and nitrogen gas is supplied in a flow rate of 10 sccm to 1000 sccm, preferably about 200 sccm. Moreover, as the transition metal layer 14 includes titanium, Cu, PrCaMn, Ni or W, the transition metal oxide layer 15 includes titanium oxide, copper oxide, PrCaMnO (PCMO), nickel oxide or tungsten oxide, accordingly. Such a transition metal oxide layer 15 suitably serves as the precursor of the data storage layer of an NVRAM cell as being able to maintain a resistivity difference between the different storage states of the cell within a certain retention time.

Referring to FIG. 1C, a second electrode layer 16 is formed on the transition metal oxide layer 15. The second electrode layer 16 may include TiN, Ti, Pt, Ta, Al or Cu, and may be formed through sputtering or electron evaporation. The thickness of the second electrode layer 16 may range from 1000 Å to 10000 Å.

Referring to FIG. 1D, the second electrode layer 16, the transition metal oxide layer 15 and the first electrode layer 13 are respectively patterned into a second electrode, a data storage layer and a first electrode, exposing a portion of the underlying conductive layer 12.

Then, a dielectric layer that may include silicon oxide is formed on the conductive layer 12 covering the sidewalls of the first electrode 13, the data storage layer 15 and the second electrode 16. The method for forming such a dielectric layer may include the following steps. First, as shown in FIG. 1E, a dielectric material 17 is deposited over the conductive layer 12 covering the first electrode 13, the data storage layer 15 and the second electrode 16. After that, as shown in FIG. 1F, the dielectric material 17 and the top surface 16a of the second electrode 16 are planarized such that the top surface of the dielectric material 17 and the top surface 16a of the second electrode 16 are coplanar. The planarized dielectric material 17 is a dielectric layer 17' that covers the sidewalls of the first electrode 13, the transition metal oxide layer 15 and the second electrode 16.

Referring to FIG. 1G a bit line 18 is then formed on the dielectric layer 17' and the second electrode 16. The bit line 18 may include Cu, Al or Ag, and may be formed through sputtering or electron evaporation. When the conductive layer 12 and the bit line 18 both include metal, the dielectric layer 17' serves as an inter-metal dielectric (IMD) layer.

The structure of the resulting memory cell according to the embodiment of the invention is described below. Referring to FIG. 1G, the memory cell 10 includes a conductive layer 12, a first electrode 13, a transition metal oxide layer 15 as a data storage layer, a second electrode 16, a dielectric layer 17' and a bit line 18. In a preferred embodiment, the transition metal oxide layer 15 is made of titanium oxide, which is formed by plasma-oxidizing a titanium layer as a transition metal layer previously formed on the first electrode layer. Besides, the conductive layer 12 may serve as a metal conductive wire of the memory cell 10 for serially connecting a number of the memory cells 10, and may be made of copper or silver. The dielectric layer 17' is an inter metal dielectric (IMD) layer for separating the conductive layer 12 from the bit line 18 to avoid short-circuiting. The dielectric layer 17' is made of silicon oxide, for example.

According to the memory cell and the manufacturing method thereof disclosed in the above embodiment, the transition metal layer 14 is oxidized in the plasma oxidation step to form a transition metal oxide layer 15. This reduces the switching voltage required for writing data from 10V to approximately 1.5V and increases the conductivity of the memory cell 10, as compared with the prior art. Besides, according to the results of a multi-time programmable (MTP) test, the data retention time of the memory cell 10 is also increased.

Figure 2A:
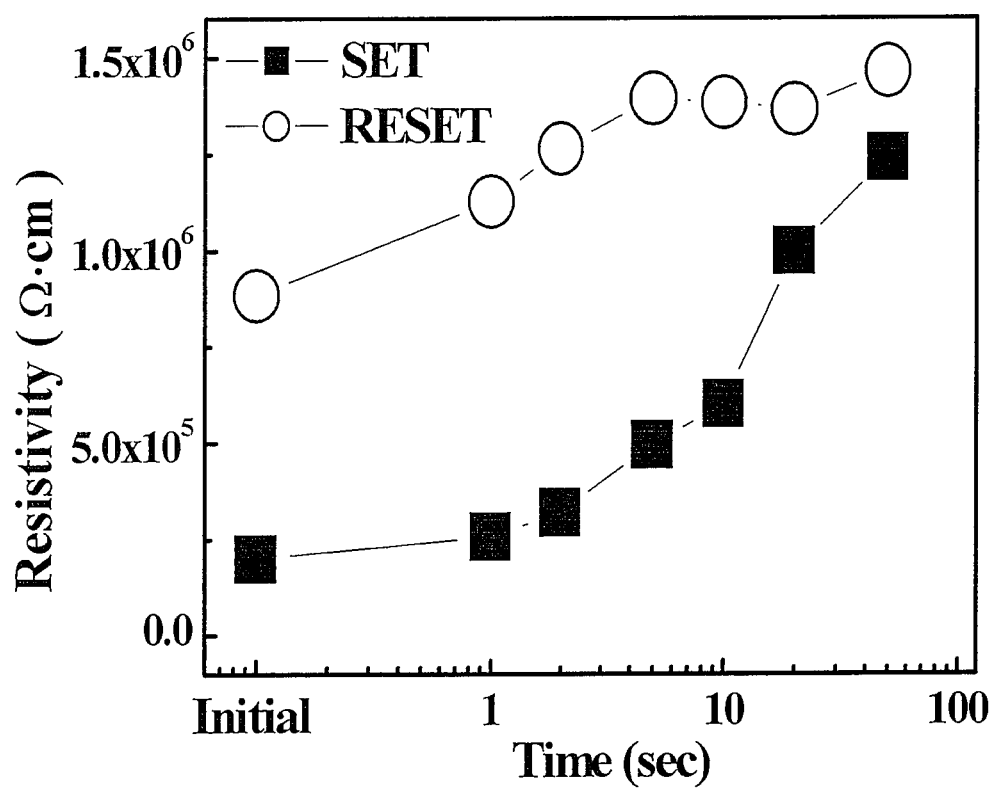
FIG. 2A is a diagram showing the resistivity-time curves respectively in a set state and a reset state of an NVRAM cell whose transition metal oxide layer is formed by deposition as in the prior art.
Figure 2B:
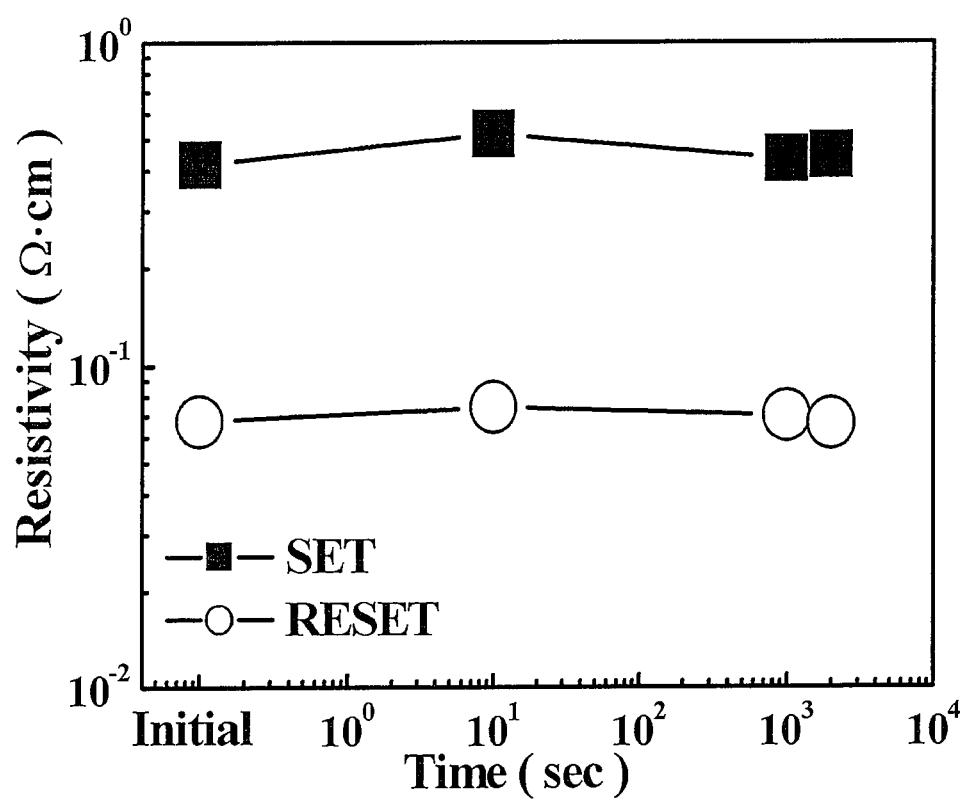
FIG. 2B is a diagram showing the resistivity-time curves respectively in a set state and a reset state of an NVRAM cell whose transition metal oxide layer is formed with a plasma oxidation step according to the embodiment of this invention.

Moreover, to inspect the effect of the manufacturing method of the transition metal oxide layer as a data storage layer to the electrical property of the same, a resistivity test is conducted for an NVRAM cell as an example of this invention and a comparative NVRAM cell in the prior art, and the test result are shown in FIGS. 2A and 2B. FIG. 2A is a diagram showing the resistivity-time curve of an NVRAM cell whose transition metal oxide layer is formed by deposition as in the prior art. FIG. 2B is a diagram showing the resistivity-time curve of an NVRAM cell whose transition metal oxide layer is formed through plasma oxidation as in this invention.

As shown in FIG. 2A, when the transition metal oxide layer is formed through deposition, the resistivity of the NVRAM cell in the set state is very close to that in the reset state after about 10 seconds, such that the NVRAM cell can no longer store data based on different resistivities. As shown in FIG. 2B, when the transition metal oxide layer is formed through plasma oxidation, the resistivities of the NVRAM cell in different states differ from each other by nearly one order of magnitude within a retention time of approximately 1,000 seconds at least.

Generally, in the memory cell of the invention, the transition metal oxide layer is formed through plasma oxidation so that the data retention time of the memory cell is prolonged, the conductivity of the memory cell is increased, and the product quality is improved. Moreover, since the switching voltage can be reduced to approximately 1.5V, the product stability is further improved. Further, the manufacturing method of a memory cell of the invention is compatible with an existing manufacturing process, and therefore the development cost of the manufacturing process can be saved.

This invention has been disclosed above in the embodiments, but is not limited thereto. It is known to one of ordinary skill in the art that some modifications and innovations may be made without departing from the spirit and scope of this invention. Hence, the scope of this invention should be defined by the following claims.

What is claimed is:

1. A process for manufacturing a memory cell, comprising:
   forming a first electrode layer on a conductive layer;
   forming a transition metal layer on the first electrode layer;
   performing a plasma oxidation step to the transition metal layer to form a transition metal oxide layer as a precursor of a data storage layer; and
   forming a second electrode layer on the transition metal oxide layer.

2. The process of claim 1, further comprising:
   patterning the second electrode layer, the transition metal oxide layer and the first electrode layer into a second electrode, the data storage layer and a first electrode, respectively; and
   forming a dielectric layer over the conductive layer covering sidewalls of the first electrode, the data storage layer and the second electrode.

3. The process of claim 2, wherein the step of forming the dielectric layer comprises:
   depositing a dielectric material over the conductive layer covering the first electrode, the data storage layer and the second electrode; and
   planarizing the dielectric material and a top surface of the second electrode, the planarized dielectric material being the dielectric layer.

4. The process of claim 2, further comprising forming a bit line on the dielectric layer and the second electrode after the dielectric layer is formed.

5. The process of claim 1, wherein the transition metal layer comprises titanium, Cu, PrCaMn, Ni or W.

6. The process of claim 1, wherein the transition metal oxide layer comprises titanium oxide, copper oxide, PrCaMnO (PCMO), nickel oxide or tungsten oxide.

7. The process of claim 1, wherein the transition metal layer is formed on the first electrode layer by chemical vapor deposition or physical vapor deposition.

8. The process of claim 1, wherein the conductive layer serves as a conductive wire of the memory cell.

9. The process of claim 1, wherein a pressure set in the plasma oxidation step ranges from 1 mTorr to 10,000 mTorr.

10. The process of claim 9, wherein the pressure set in the plasma oxidation step is about 3,000 mTorr.

11. The process of claim 1, wherein in the plasma oxidation step, oxygen gas is supplied in a flow rate of 10 sccm to 10,000 sccm.

12. The process of claim 11, wherein the oxygen gas is supplied in a flow rate of about 4,000 sccm.

13. The process of claim 1, wherein the plasma oxidation step is a down-stream (remote) plasma oxidation step.

14. The process of claim 1, wherein the data storage layer maintains a resistivity difference between different states of the memory cell within a retention time.

15. The process of claim 14, wherein the retention time is approximately 1,000 seconds at least.

16. A memory cell, comprising:
    a first electrode disposed on a conductive layer;
    a transition metal oxide layer as a data storage layer disposed on the first electrode, being formed through plasma oxidation of a transition metal layer; and
    a second electrode disposed on the data storage layer.

17. The memory cell of claim 16, further comprising:
    a dielectric layer disposed over the conductive layer covering sidewalls of the first electrode, the transition metal oxide layer and the second electrode, wherein a top surface of the dielectric layer and a top surface of the second electrode are coplanar.

18. The memory cell of claim 17, further comprising:
    a bit line disposed on the second electrode and the dielectric layer.

19. The memory cell of claim 18, wherein the dielectric layer is an inter-metal dielectric (IMD) layer.

20. The memory cell of claim 17, wherein the dielectric layer comprises silicon oxide.

21. The memory cell of claim 16, wherein the transition metal oxide layer comprises titanium oxide, copper oxide, PrCaMnO (PCMO), nickel oxide or tungsten oxide.

22. The memory cell of claim 16, wherein the conductive layer serves as a conductive wire of the memory cell.

23. The memory cell of claim 16, which is a memory cell of a non-volatile random-access memory (NVRAM).

24. The memory cell of 16, wherein the data storage layer maintains a resistivity difference between different states of the memory cell within a retention time.

25. The memory cell of claim 24, wherein the retention time is approximately 1,000 seconds at least.

* * * * *